US012650456B2

(12) United States Patent (10) Patent No.: US 12,650,456 B2

Rummey (45) Date of Patent: Jun. 9, 2026

(54) METHOD OF TESTING A SEMICONDUCTOR DEVICE AS WELL AS A CORRESPONDING TESTING DEVICE

(71) Applicant: NEXPERIA B.V., Nijmegen (NL)

(72) Inventor: Magnus Siegfried Rummey, Hamburg (DE)

(73) Assignee: Nexperia B.V., Nijmegen (NL)

( * ) Notice: Subject to any disclaimer, the term of this patent is extended or adjusted under 35 U.S.C. 154(b) by 432 days.

(21) Appl. No.: 18/332,574

(22) Filed: Jun. 9, 2023

(65) Prior Publication Data

US 2023/0400503 A1 Dec. 14, 2023

(30) Foreign Application Priority Data

Jun. 10, 2022 (EP) ...................................... 22178333

(51) Int. Cl.
*G01R 31/26* (2020.01)

(52) U.S. Cl.
CPC ................................ *G01R 31/2623* (2013.01)

(58) Field of Classification Search
CPC ............ G01R 31/2896; G01R 31/2607; G01R 31/2623
USPC .................................................... 324/762.09
See application file for complete search history.

(56) References Cited

U.S. PATENT DOCUMENTS

| | | | |
|---|---|---|---|
| 6,292,011 B1 * | 9/2001 | Wakabayashi ....... | G01R 31/261 |
| | | | 324/762.08 |
| 2006/0197602 A1 * | 9/2006 | Rotay ................ | G01R 31/2623 |
| | | | 330/298 |

OTHER PUBLICATIONS

Peev; "Calculation of Power Losses of MOSFET Transistors by Experimental Data"; Pub Oct. 2017; Journal of Multidisciplinary Engineering Science and Technology; vol. 4, Issue 10; pp. 8504-8509 (Year: 2017).*
Vinnakota; "Monitoring Power Dissipation for Fault Detection"; Pub Oct. 1997; Journal of Electronic Testing; vol. 11; pp. 173-181 (Year: 1997).*

* cited by examiner

*Primary Examiner* — Alesa Allgood
*Assistant Examiner* — Rahul Maini
(74) *Attorney, Agent, or Firm* — Ruggiero McAllister & McMahon LLC

(57) ABSTRACT

A method of testing a semiconductor device, in a package, having a junction between a semiconductor material of a first type and a semiconductor material of a second type. The junction has a temperature dependent breakdown voltage, and the method includes the steps of determining the breakdown voltage, providing a fixed voltage over the junction, via pins of the package, and the fixed voltage is higher than the breakdown voltage, and measuring, via pins of the package, a breakdown current flowing through the junction, determining a dissipated power based on the fixed voltage and the measured breakdown current, and the dissipated power is a qualitive measure for the semiconductor device.

18 Claims, 3 Drawing Sheets

11

1

METHOD OF TESTING A SEMICONDUCTOR DEVICE AS WELL AS A CORRESPONDING TESTING DEVICE

CROSS-REFERENCE TO RELATED APPLICATIONS

This application claims the benefit under 35 U.S.C. § 119(a) of European Application No. 22178333.5 filed Jun. 10, 2022, the contents of which are incorporated by reference herein in their entirety.

BACKGROUND

1. Field of the Disclosure

The present disclosure is related to testing of semiconductor devices and, more specifically, to testing semiconductor devices in mass production with an avalanche test in which the breakdown voltage of a junction comprised by the semiconductor devices is exceeded.

2. Description of the Related Art

Semiconductor devices in mass production can have various defects and putting them into avalanche is a method to destroy weak/faulty devices. This requires either special equipment, an unclamped inductive switching, UIS, gear or the semiconductor device can be put into avalanche with a normal multi-purpose measurement equipment.

The currently used method is to apply a constant current avalanche pulse for 500 μs. Force trials have shown that this cannot screen defects as well as the UIS test. UIS test equipment is expensive, and it can be the slowest equipment to connect to the test handler and may slow down the handlers reducing the potential units per hour, UPH, which can be tested. For some handlers, the time a semiconductor device stays at a station to be measured may increase from <30 ms to >50 ms when using UIS equipment.

Semiconductor devices in mass production are tested with another test to filter out devices which have a bad die attach. The currently used method measures the junction forward voltage at a low current, then heats up the junction of the device using a defined power for a defined pulse time and then measures that same junction forward voltage again. The difference between the two measurements is proportional to the increase in junction temperature and that is a measure for the thermal impedance and can help find devices with a bad die attach. This method needs to switch between applying power and measurement and that requires to wait for the test to settle and that settling time limits the accuracy of this method.

Having to test a semiconductor device in <30 ms is challenging with respect to self-heating of the devices during the test. Both methods described above, avalanche testing and die attach testing, create significant self-heating, which influences the results of nearly every test which comes after them. They also influence each other and no matter which of these two tests comes first, the second one is negatively influenced.

If the die attach test is made first, the avalanche test can apply less current before the maximum junction temperature is reached, limiting the effectivity of the test to detect defects. If the avalanche test is made first, the device starts the die attach test at an elevated junction temperature and the cooling of the junction temperature from the avalanche test is superimposed on the heating of the die attach test resulting in much lower and less accurate values. Putting other tests in between the die attach test and the avalanche test can mitigate these effects to some degree, but these tests may cause themselves heating or may be influenced by the increased junction temperature. Another option would be a waiting time, but that does slow down the handler and reduces the total number of units per hour.

SUMMARY

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

It is an object of the present disclosure to provide for a method of testing a semiconductor device. It is a further object of the present disclosure to provide for a testing device for testing semiconductor devices, as well as a corresponding computer program product.

In a first aspect, there is provided a method of testing a semiconductor device, in a package, having a junction between a semiconductor material of a first type and a semiconductor material of a second type, wherein said junction has a temperature dependent breakdown voltage, said method comprises the steps of:

determining said breakdown voltage;

providing a fixed voltage over said junction, via pins of said package, wherein said fixed voltage is higher then said breakdown voltage, and measuring, via pins of said package, a breakdown current flowing through said junction;

determining a dissipated power based on said fixed voltage and said measured breakdown current, wherein said dissipated power is a qualitive measure for said semiconductor device.

The inventors have found that it may be beneficial to create a test method in which the junction temperature of the semiconductor device is fixed such that the stress level is fixed and independent of variations in thermal impedance or specific breakdown voltage of the semiconductor device. This is explained in more detail here below.

It was noted that the breakdown voltage of semiconductor device may be in good approximation proportional to the junction temperature of the semiconductor device. Forcing a semiconductor device into avalanche, i.e., into breakdown with a fixed voltage, may therefore be regarded as equivalent to forcing the semiconductor device to a fixed junction temperature.

The power, or current, that is required to keep the device at this fixed junction temperature can be measured without additional setting time.

In the second step of the above-described method, the voltage over the junction, via pins of the package, is to be fixed. That means that the voltage is kept constant during this step of the method, at least until the breakdown current is measured. The breakdown current is thus measured with this fixed voltage over the junction.

The current through the semiconductor device, when the fixed voltage is applied, may be in the form of an initial overshoot before a steady-state current is reached. The specific shape of the amount current over time may be a measure of the quality of the semiconductor device and/or the steady-state current may be a measure of the quality of the semiconductor device.

More specifically, the shape of the current may contain the information for the thermal impedance and the steady state current may be used to calculate the thermal resistance value. In a mass production environment, it may be beneficial to not wait until the steady-state is reached. This could take too much time.

It is noted that the presented method may be used for determining the thermal impedance, which may be determined from the shape of the current waveform, and/or may be used to determine the thermal resistance, which may be determined from the steady-state current.

The maximum current reached in the spike may say something about the limiting single pulse avalanche current for which the semiconductor device is rated.

The dissipated power may be determined, explicitly or implicitly, based on the fixed voltage and the measured current, and the dissipated power may be a measure for the quality of the semiconductor device.

It is noted that the semiconductor device may be tested once assembled in a package, such that any applied current and/or voltage is applied to the pins of the package comprising that semiconductor device.

It is further noted that the present application describes that there is a junction present in the semiconductor device between a semiconductor material of the first type and a semiconductor material of the second type. Typically, these kinds of junctions are construed in that the doping concentration of, for example, P-type dopants versus N-type dopants changes which creates a so-called PN junction. A doping concentration profile may be in place for both dopants and it may thus be considered a gradual change of a property of a material instead of a harsh change of one material to the next material.

In an example, the step of determining said breakdown voltage comprises:

providing a fixed breakdown current through said junction, via pins of said package, and measuring a breakdown voltage, via pins of said package, over said junction, wherein said voltage being said breakdown voltage.

The inventors have found that it might be beneficial to actually measure the breakdown voltage of a semiconductor device. In order to do so, a fixed current may be applied, for example in the range of 0.1 mA-5 mA, and the breakdown voltage may be measured. This may provide the most accurate results.

In a detailed example hereof, the step of providing said fixed voltage comprises:

providing said fixed voltage, being about 1.05-2 times, preferably 1.05-1.5 times, and even more preferably 1.05-1.25 times said determined breakdown voltage.

Preferably, the fixed voltage may be in the range of 1.16 times the measured, or predetermined, breakdown voltage of the semiconductor device.

In a further example, the method comprises the step of:

determining that said semiconductor device is faulty when said determined dissipated power falls below a predetermined power threshold.

In a further example, the semiconductor device is a Metal Oxide Semiconductor, MOS, Field Effect Transistor, FET.

The semiconductor device may be any semiconductor device having a junction but is especially suitable for MOSFET's. Other types of semiconductor devices include diodes and other types of transistors.

In even a further example, the semiconductor material of said first type is semiconductor material of N-type, and semiconductor material of said second type is semiconductor material of P-type, such that a PN junction is provided.

In a second aspect of the present disclosure, there is provided a testing device for testing a semiconductor device, in a package, having a junction between a semiconductor material of a first type and a semiconductor material of a second type, wherein said junction has a temperature dependent breakdown voltage, said testing device comprising:

process equipment arranged for determining said breakdown voltage;

provide equipment arranged for providing a fixed voltage over said junction, via pins of said package, wherein said fixed voltage is higher then said breakdown voltage, and measuring, via pins of said package, a breakdown current flowing through said junction;

wherein said process equipment is further arranged for determining a dissipated power based on said fixed voltage and said measured breakdown current, wherein said dissipated power is a qualitive measure for said semiconductor device.

It is noted that the advantages as explained with reference to the first aspect of the present disclosure, being the method of testing a semiconductor device, are also applicable to the second aspect of the present disclosure, being the corresponding testing device.

In an example, the provide equipment is further arranged for:

providing a fixed breakdown current through said junction, via pins of said package, and measuring a breakdown voltage, via pins of said package, over said junction, wherein said voltage being said breakdown voltage.

In a further example, the provide equipment is further arranged for providing a fixed breakdown current in a range of 0.1 mA-5 mA.

In another example, the provide equipment is further arranged for:

providing said fixed voltage, being about 1.05-2 times, preferably 1.05-1.5 times, and even more preferably 1.05-1.25 times said determined breakdown voltage.

In a further example, the process equipment is further arranged for determining that said semiconductor device is faulty when said determined dissipated power falls below a predetermined power threshold.

In yet another example, the semiconductor device is a Metal Oxide Semiconductor, MOS, Field Effect Transistor, FET.

In an example, the semiconductor material of said first type is semiconductor material of N-type, and semiconductor material of said second type is semiconductor material of P-type.

In a third aspect of the present disclosure, there is provided a computer program product comprising a computer readable medium having instructions stored thereon which, when executed by a testing device, cause said testing device to implement a method in accordance with any of the method examples provided above.

The present disclosure is described in conjunction with the appended FIGS. It is emphasized that, in accordance with the standard practice in the industry, various features are not drawn to scale. In fact, the dimensions of the various features may be arbitrarily increased or reduced for clarity of discussion.

In the appended FIGS., similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The above and other aspects of the disclosure will be apparent from and elucidated with reference to the examples described hereinafter.

DETAILED DESCRIPTION

Figure 1:
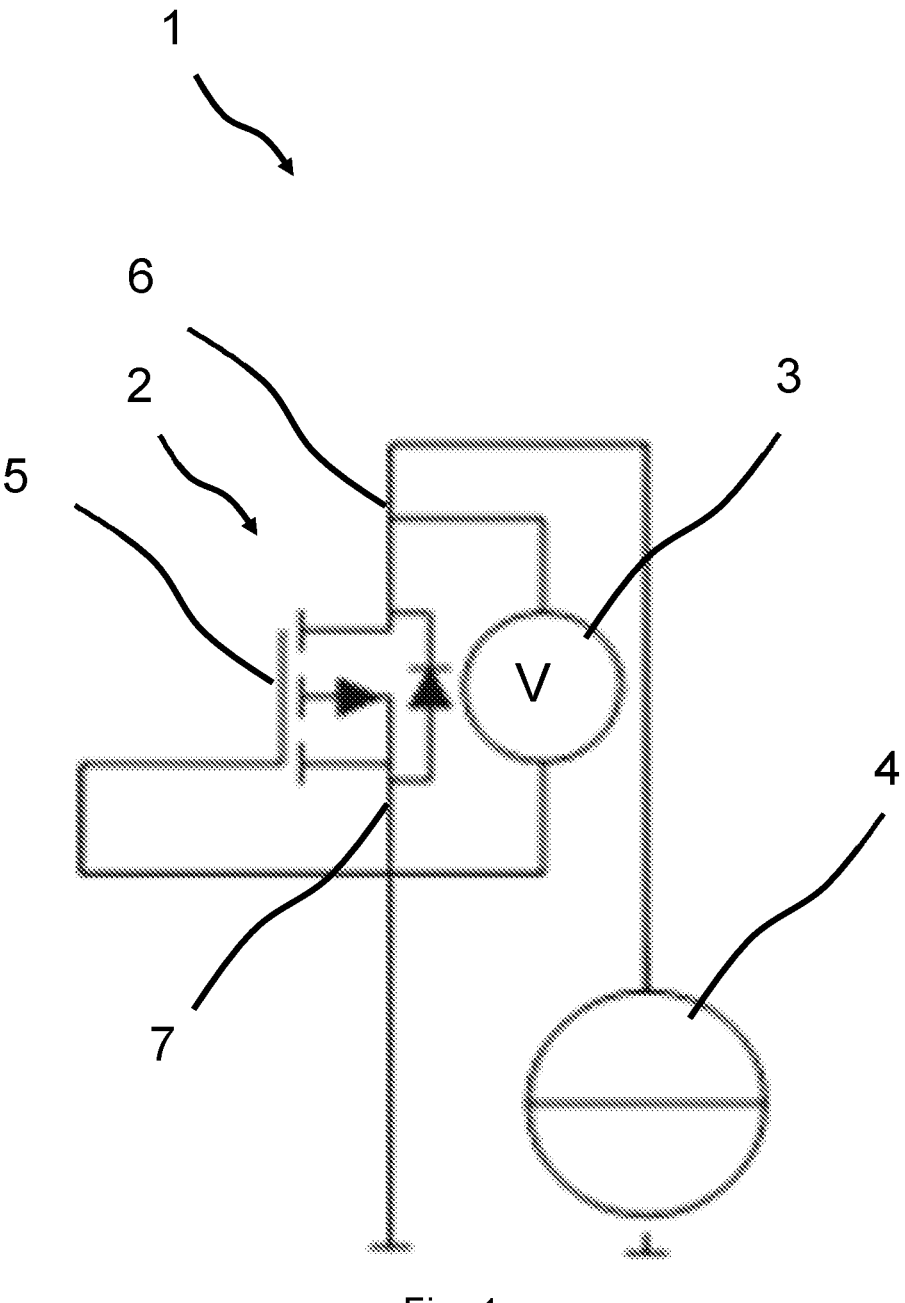
FIG. 1 discloses a test circuit for determining the breakdown voltage in accordance with the present disclosure.

It is noted that in the description of the FIGS., same reference numerals refer to the same or similar components performing a same or essentially similar function.

A more detailed description is made with reference to particular examples, some of which are illustrated in the appended drawings, such that the manner in which the features of the present disclosure may be understood in more detail. It is noted that the drawings only illustrate typical examples and are therefore not to be considered to limit the scope of the subject matter of the claims. The drawings are incorporated for facilitating an understanding of the disclosure and are thus not necessarily drawn to scale. Advantages of the subject matter as claimed will become apparent to those skilled in the art upon reading the description in conjunction with the accompanying drawings.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise", "comprising" and the like are to be construed in an inclusive sense, as opposed to an exclusive or exhaustive sense; that is to say, in the sense of "including, but not limited to." As used herein, the terms "connected", "coupled" or any variant thereof means any connection or coupling, either direct or indirect, between two or more elements; the coupling or connection between the elements can be physical, logical, electromagnetic, or a combination thereof. Additionally, the words "herein," "above", "below" and words of similar import, when used in this application, refer to this application as a whole and not to any particular portions of this application. Where the context permits, words in the Detailed Description using the singular or plural number may also include the plural or singular number respectively. The word "or" in reference to a list of two or more items, covers all of the following interpretations of the word: any of the items in the list, all of the items in the list, and any combination of the items in the list.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

Figure 2:
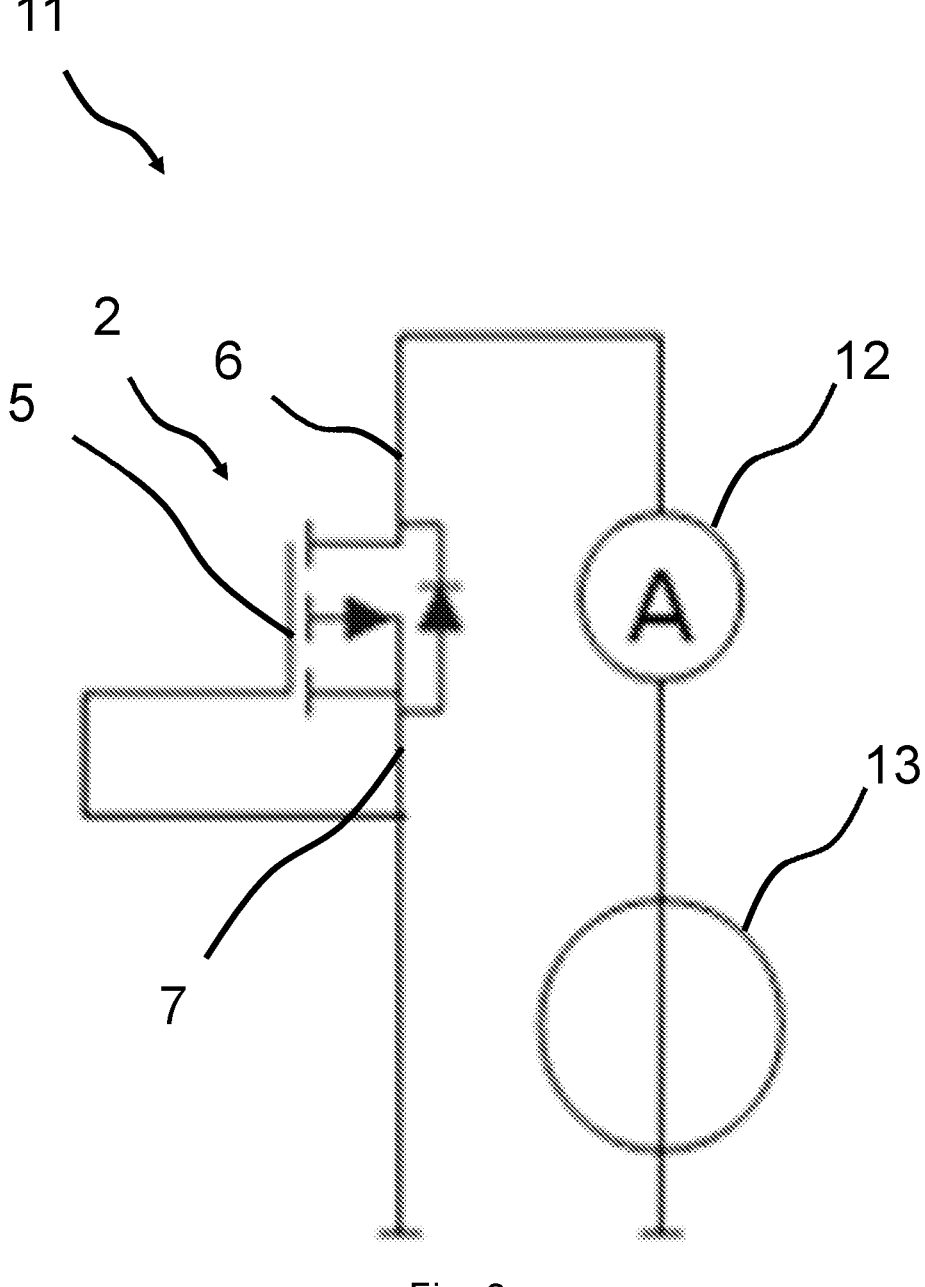
FIG. 2 discloses a test circuit for testing a semiconductor device in accordance with the present disclosure.

FIG. 1 discloses a test circuit 1 for determining the breakdown voltage in accordance with the present disclosure. FIG. 2 discloses a test circuit 11 for testing a semiconductor device in accordance with the present disclosure.

FIGS. 1 and 2 are elaborated below in the context of the claims of the present disclosure.

The test circuits 1 and 11 are utilized to support a method of testing the semiconductor device 2, which semiconductor 2 is encompassed in a package. The package has several pins, which pins are connected to the corresponding semiconductor die of the semiconductor device, for providing connections of the semiconductor die to the outside world.

It is noted that these types of connection may, in practice, cause reliability issues due to glue that is used, the solder that is used, mismatch in alignment or any other type of issue.

The semiconductor device 2 has a junction between a semiconductor material of a first type and a semiconductor material of a second type. In the present case, a Metal Oxide Semiconductor, MOS, Field Effect Transistor, FET is shown having a drain 6, a gate 5 and a source 7. More specifically, the MOSFET 2 is of the PMOS type.

The PMOS 2 basically has two junctions a P-N junction and an N-P junction. The junction of the PMOS 2 has a temperature dependent breakdown voltage 3. The breakdown voltage is the voltage between the drain 6 and the source 7.

FIG. 1 is directed to a test setup for actually measuring the breakdown voltage 3 of the MOSFET 2. In order to do so, a current source 4 is connected to the drain 6 of the MOSFET 2. The current source 4 will make sure that a current starts to flow between, which current is a breakdown current given that the MOSFET 2 is put in an avalanche mode. This breakdown current, i.e. avalanche current, will cause a voltage to appear across the drain 6 and the source 7, which is then defined as the breakdown voltage. It may be beneficial to set the current source to a relatively low current to more accurately determine the breakdown voltage.

One of the reasons for a relatively low current is to avoid/minimize self-heating.

The difference of FIG. 2 compared to FIG. 1 is that, in this case, a fixed voltage is provided over the junction using a voltage source as indicated with reference numeral 13. The fixed voltage is provided to the MOSFET 2 via pins of the package. The fixed voltage is higher than the measured breakdown voltage, i.e. measured in accordance with the test circuit of FIG. 1.

The fixed voltage may, for example, be 1.2 times as high as the breakdown voltage measured in accordance with the test circuit of FIG. 1 to assure that the MOSFET 2 is in breakdown. Using such a factor assures that the junction temperature of the device is going to be at a particular value.

MOSFETs typically operate in three regimes depending on the drain-source voltage for a given gate voltage. Initially the current-voltage relation is linear, this is the Ohmic region. As the drain-source voltage increases the extracted current begins to saturate, this is the saturation region. As the drain-source voltage is further increased the breakdown region is entered, where the current increases exponentially for a small increase in the applied voltage. This is due to impact ionization.

The breakdown current is measured 12, which breakdown current is a measure for the quality of the semiconductor device 2.

Figure 3:
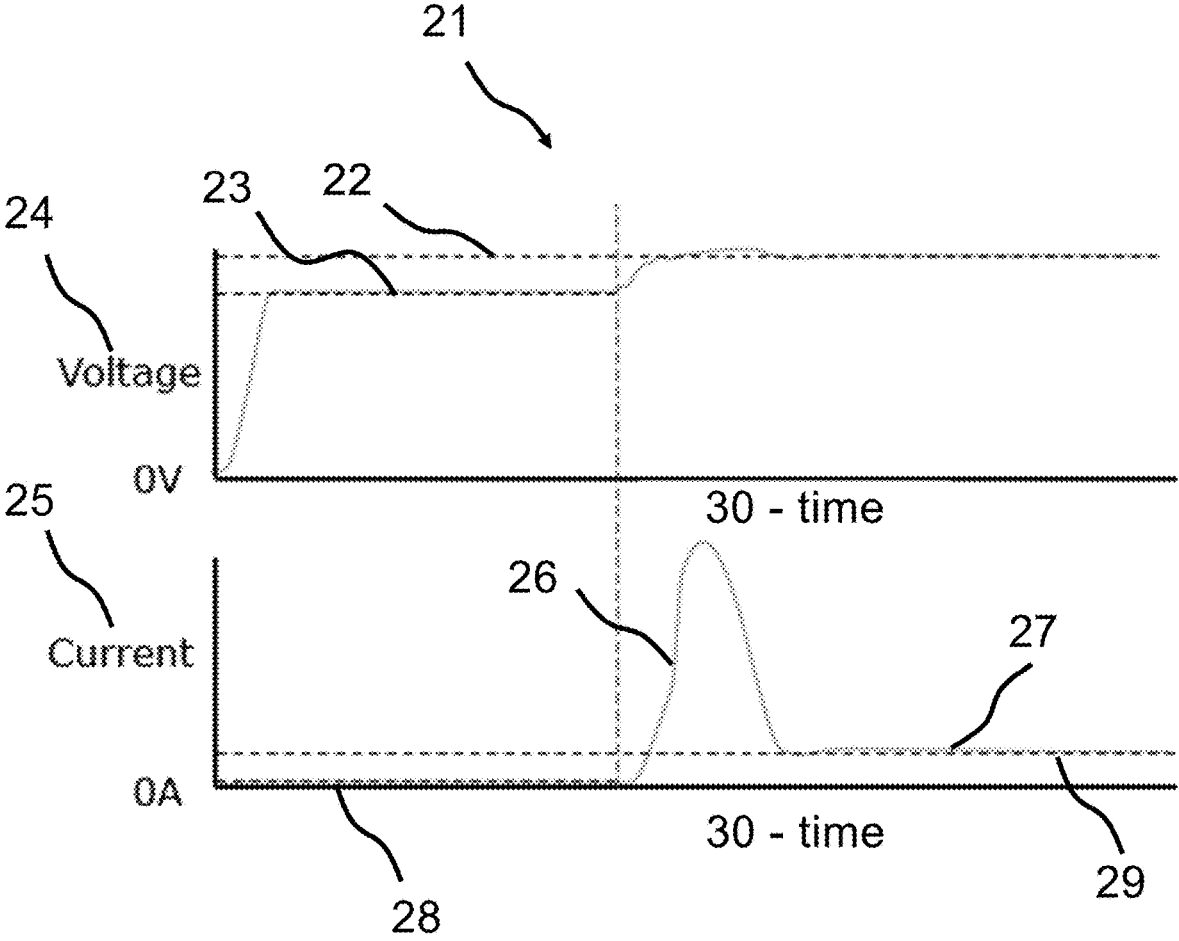
FIG. 3 discloses waveforms associated with the test circuit in accordance with the present disclosure.

FIG. 3 discloses waveforms 21 associated with the test circuit in accordance with the present disclosure.

The top waveform shows the drain-source voltage 24 over time 30. First, as indicated with reference numeral 23, the breakdown voltage of the corresponding semiconductor device may be established using the testing circuit shown in FIG. 1. Next, using the testing circuit in FIG. 2, a particular fixed voltage may be provided over the junction of the MOSFET to ensure that the MOSFET is in breakdown. This is indicated with reference numeral 22.

The bottom waveform shown the current 25 through the MOSFET over time 30. Initially, as indicated with reference numeral 28. Initially, as discussed with respect to FIG. 1, the current 28 is fixed to a very small amount using a current source. This will ensure that the breakdown voltage will be present across the drain source terminals of the MOSFET. Next, when the voltage over the MOSFET is actually set by a voltage source, in accordance with the testing circuit of FIG. 2, a much larger current will start to flow through the MOSFET. This initial breakdown current spike has reference numeral 26. The maximum current reached in the spike 26 may say something about the limiting single pulse avalanche current for which the semiconductor device is rated. After the initial spike and possibly some equipment related oscillations the measurement settles to a slow monotonic decreasing current 27. The shape of this current is a measure for the thermal impedance and its dependence on the pulse length of the MOSFET within its package. The current may settle after a few minutes and is a measure for the thermal resistance of the MOSFET within its package and environment.

In this example there is an ideal pulse time 29 at which the current is measured to determine the power as a measure of the quality of the die attach of the MOSFET.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope thereof.

LIST OF REFERENCE NUMERALS

1. Test circuit
2. Semiconductor device
3. Breakdown voltage
4. Current source
5. Gate
6. Drain
7. Source
11. Test circuit
12. Breakdown current
13. Voltage source
21. Waveforms
22. Fixed voltage
23. Breakdown voltage
24. Drain-source voltage
25. Current
26. Breakdown current spike
27. Monotonic decreasing current
28. Current
29. Ideal pulse time
30. Time

What is claimed is:

1. A method of testing a semiconductor device, in a package, having a junction between a semiconductor material of a first type and a semiconductor material of a second type, wherein the junction has a temperature dependent breakdown voltage, the method comprises the steps of:
  determining the breakdown voltage;
  providing a fixed voltage over the junction, via pins of the package, wherein the fixed voltage is higher than the breakdown voltage, and measuring, via the pins of the package, a breakdown current flowing through the junction; and
  determining a dissipated power based on the fixed voltage and the measured breakdown current, wherein the dissipated power is a qualitive measure for the semiconductor device.

2. The method in accordance with claim 1, wherein the step of determining the breakdown voltage comprises:
  providing a fixed breakdown current through the junction, via the pins of the package, and measuring a voltage, via the pins of the package, over the junction, wherein the voltage is the breakdown voltage.

3. The method in accordance with claim 1, wherein the step of providing the fixed voltage comprises:
  providing the fixed voltage, that is about 1.05-2 times the determined breakdown voltage.

4. The method in accordance with claim 1, wherein the method comprises the step of:
  determining that the semiconductor device is faulty when the determined dissipated power falls below a predetermined power threshold.

5. The method in accordance with any claim 1, wherein the semiconductor device is a Metal Oxide Semiconductor (MOS), Field Effect Transistor (FET).

6. The method in accordance with claim 1, wherein:
  the semiconductor material of the first type is of N-type, and the semiconductor material of the second type is of P-type.

7. The method in accordance with claim 2, wherein the step of providing comprises providing the fixed breakdown current in a range of 0.1 mA-5 mA.

8. The method in accordance with claim 2, wherein the step of providing the fixed voltage comprises:

providing the fixed voltage, that is about 1.05-2 times the determined breakdown voltage.

9. The method in accordance with claim 2, wherein the method comprises the step of:

determining that the semiconductor device is faulty when the determined dissipated power falls below a predetermined power threshold.

10. The method in accordance with any claim 2, wherein the semiconductor device is a Metal Oxide Semiconductor (MOS), Field Effect Transistor (FET).

11. A testing device for testing a semiconductor device, in a package, having a junction between a semiconductor material of a first type and a semiconductor material of a second type, wherein the junction has a temperature dependent breakdown voltage, the testing device comprising:

process equipment arranged to determine the breakdown voltage;

provide equipment arranged to provide a fixed voltage over the junction, via pins of the package, wherein the fixed voltage is higher than the breakdown voltage, and measuring, via the pins of the package, a breakdown current flowing through the junction;

wherein the process equipment is further arranged for determining a dissipated power based on the fixed voltage and the measured breakdown current, and wherein the dissipated power is a qualitive measure for the semiconductor device.

12. The testing device in accordance with claim 11, wherein the provide equipment is further arranged to:

provide a fixed breakdown current through the junction, via the pins of the package, and measuring a voltage, via the pins of the package, over the junction, wherein the voltage is the breakdown voltage.

13. The testing device in accordance with claim 11, wherein the provide equipment is further arranged to:

provide the fixed voltage that is about 1.05-2 times the determined breakdown voltage.

14. The testing device in accordance with claim 11, wherein the process equipment is further arranged to determine that the semiconductor device is faulty when the determined dissipated power falls below a predetermined power threshold.

15. The testing device in accordance with claim 11, wherein the semiconductor device is a Metal Oxide Semiconductor (MOS), Field Effect Transistor (FET).

16. A testing device in accordance with claim 11, wherein:

the semiconductor material of the first type is of N-type, and the semiconductor material of the second type of P-type.

17. The testing device in accordance with claim 12, wherein the provide equipment is further arranged to provide the fixed breakdown current in a range of 0.1 mA-5 mA.

18. A computer program product comprising a non-transitory computer readable medium having instructions stored thereon which, when executed by a testing device, cause the testing device to implement the method in accordance with claim 1.

\* \* \* \* \*